United States Patent
Yun et al.

(10) Patent No.: US 9,599,675 B2
(45) Date of Patent: Mar. 21, 2017

(54) APPARATUS FOR CONTROLLING BATTERY PACK, AND ENERGY STORAGE SYSTEM INCLUDING THE APPARATUS

(75) Inventors: Han-Seok Yun, Yongin-si (KR); Jong-Woon Yang, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 1055 days.

(21) Appl. No.: 13/554,998

(22) Filed: Jul. 20, 2012

(65) Prior Publication Data
US 2013/0144547 A1    Jun. 6, 2013

(30) Foreign Application Priority Data
Dec. 6, 2011    (KR) .................. 10-2011-0129906

(51) Int. Cl.
*H02J 7/00*      (2006.01)
*G01R 31/36*   (2006.01)

(52) U.S. Cl.
CPC ..... *G01R 31/3624* (2013.01); *G01R 31/3651* (2013.01); *G01R 31/3658* (2013.01)

(58) Field of Classification Search
CPC .............. Y02T 10/7005; Y02T 10/7044; H02J 7/0026; H02J 7/0031; H02J 7/0068; H02J 7/0029; H02J 7/007; H02J 7/047
USPC ........................................ 320/132, 134–136
See application file for complete search history.

(56) References Cited

U.S. PATENT DOCUMENTS

| | | | |
|---|---|---|---|
| 7,969,119 B2 * | 6/2011 | Odaohhara | H02J 7/045 320/134 |
| 2007/0024242 A1 | 2/2007 | Seo et al. | |
| 2008/0036421 A1 | 2/2008 | Seo et al. | |
| 2008/0077339 A1 | 3/2008 | Seo et al. | |
| 2008/0238371 A1 * | 10/2008 | Tamezane | G01R 31/361 320/134 |

(Continued)

FOREIGN PATENT DOCUMENTS

| | | |
|---|---|---|
| JP | 2007-40991 A | 2/2007 |
| KR | 10-2003-0031772 A | 4/2003 |

(Continued)

OTHER PUBLICATIONS

Korean Office Action dated Jan. 16, 2016 for Korean Patent Application No. KR 10-2011-0129906 from which subject U.S. Appl. No. 13/554,998 claims priority.

(Continued)

*Primary Examiner* — Nghia Doan
(74) *Attorney, Agent, or Firm* — Knobbe Martens Olson & Bear LLP (57) ABSTRACT

An apparatus for controlling a battery pack and an energy storage system including the apparatus are disclosed. In one embodiment, the battery pack includes at least one battery tray each including one or more battery cells. The apparatus may include an open circuit voltage (OCV) calculator and a state of charge (SOC) estimator. The OCV calculator may receive OCV measurement values of the battery cells of each battery tray when the power of the battery pack is turned on, and calculate a final OCV of the battery cells based at least in part on the OCV measurement values. The SOC estimator may extract an SOC value corresponding to the final OCV from an SOC table and estimate the extracted SOC value as an initial SOC.

19 Claims, 9 Drawing Sheets

(56) References Cited

U.S. PATENT DOCUMENTS

2011/0161025 A1* 6/2011 Tomura .............. G01R 31/3651
  702/63
2014/0184166 A1* 7/2014 Ohkawa .............. H01M 10/441
  320/134

FOREIGN PATENT DOCUMENTS

| KR | 10-2008-0014207 A | 2/2008 |
| KR | 10-2008-0014439 A | 2/2008 |
| KR | 10-2008-0028161 A | 3/2008 |
| KR | 10-2008-0064917 A | 7/2008 |

OTHER PUBLICATIONS

Korean Registration Determination Certificate dated Jul. 1, 2016 for Korean Patent Application No. KR 10-2011-0129906, and from which subjection U.S. Application No. 13/554,998 claims priority.

* cited by examiner

APPARATUS FOR CONTROLLING BATTERY PACK, AND ENERGY STORAGE SYSTEM INCLUDING THE APPARATUS

RELATED APPLICATIONS

This application claims the benefit of Korean Patent Application No. 10-2011-0129906, filed on Dec. 6, 2011, in the Korean Intellectual Property Office, the disclosure of which is incorporated herein in its entirety by reference.

BACKGROUND

1. Field

The described technology generally relates to an apparatus for controlling a battery pack and an energy storage system including the same.

2. Description of the Related Technology

As issues on environmental destruction and natural resource depletion have grown, battery power storage and how to efficiently use stored power are drawing more attention from the research community. Also, renewable energy sources that do not cause environmental pollution during power generation generally require battery storage because of their inherently intermittent qualities. An energy storage system connects a renewable energy generator, a rechargeable battery that can be selectively charged and discharged, and a power system or load, and much research has been directed to controlling the large numbers of battery cells required for many high power applications.

SUMMARY

One inventive aspect is an energy storage system in which batteries are efficiently managed in terms of charge, discharge, a state of charge (SOC), or the like.

Another aspect is a battery pack control apparatus that accurately estimates a state of charge (SOC) in consideration of a state of a battery, and an energy storage system including the battery pack control apparatus.

Another aspect is an apparatus for controlling a battery pack which includes at least one battery tray each including one or more battery cells, wherein the apparatus includes: an open circuit voltage (OCV) calculation unit that receives OCV measurement values of the battery cells of each battery tray when power of the battery pack is on, and that according to the OCV measurement values, calculates a final OCV of the battery cells; and a state of charge (SOC) estimation unit that extracts an SOC value corresponding to the final OCV from an SOC table and estimates the extracted SOC value as an initial SOC.

The OCV calculation unit may set a current at which an OCV of each of the battery cells is measured to be equal to or lower than the amplitude of a reference current.

The amplitude of the reference current may be 3 A.

The battery pack control device may further include a computing unit that calculates an average of OCVs of the battery cells, wherein a minimum OCV and a maximum OCV are not taken into consideration.

The OCV calculation unit may multiply the OCV average with the total number of battery cells to obtain a final OCV.

The battery pack control device may further include a sampling unit that selects a predetermined number of battery cells from the total number of battery cells.

The OCV calculation unit may calculate an average of OCVs of the selected battery cells and may multiple the calculated OCV average by the total number of the whole battery cells.

The battery pack control apparatus may further include: a data storage unit for storing a previous SOC storage time; and a comparison unit that compares a difference between the previous SOC storage time and a current time with a reference time when power of the battery pack is on.

The reference time may be a time required for the SOC of the battery cells to be reduced by 10% due to self discharge.

If the difference between the previous SOC storage time and the current time is equal to or longer than the reference time, the OCV calculation unit adds OCV measurement values of the battery cells to obtain a final OCV of the battery cells.

If the difference between the previous SOC storage time and the current time is shorter than the reference time, the SOC estimation unit estimates the previously stored SOC value as an initial SOC.

Another aspect is an energy storage system which includes a battery pack including at least one battery tray each including one or more battery cells, wherein the battery tray is selectively connected to a power generation system and/or a system to supply power to a charge and/or the system, and the energy storage system includes: an open circuit voltage (OCV) calculation unit that receives OCV measurement values of the battery cells of each battery tray when power of the battery tray is on, and that according to the OCV measurement values, calculates a final OCV of the battery cells; and a state of charge (SOC) estimation unit that extracts an SOC value corresponding to the final OCV from an SOC table and estimates the extracted SOC value as an initial SOC. Another aspect is an apparatus for controlling a battery pack which comprises at least one battery tray each comprising one or more battery cells, the apparatus comprising: an open circuit voltage (OCV) calculator configured to receive OCV measurement values of the battery cells of each battery tray when the power of the battery pack is turned on, and calculate a final OCV of the battery cells based at least in part on the OCV measurement values; and a state of charge (SOC) estimator configured to extract an SOC value corresponding to the final OCV from an SOC table and estimate the extracted SOC value as an initial SOC.

In the above apparatus, the OCV calculator is configured to set a current at which an OCV of each of the battery cells is measured to be less than or equal to the amplitude of a reference current. In the above apparatus, the amplitude of the reference current is about 3 Ampere. The above apparatus further comprises an average OCV calculator configured to calculate an average of OCVs of the battery cells, wherein the minimum OCV and the maximum OCV are not taken into consideration. In the above apparatus, the OCV calculator is configured to multiply the OCV average by the total number of battery cells to obtain the final OCV.

The above apparatus further comprises a sampler configured to select a predetermined number of battery cells from the total number of the battery cells. In the above apparatus, the OCV calculator is configured to calculate an average of OCVs of the selected battery cells and multiply the calculated OCV average by the total number of the battery cells. The apparatus further comprises: a memory storing a previous SOC storage time; and a comparator configured to compare the previous SOC storage time with a reference time when the power of the battery pack is turned on.

In the above apparatus, the reference time is a time required for the SOC of the battery cells to be reduced by about 10% via the self discharge of the battery cells. In the above apparatus, if the previous SOC storage is equal to or longer than the reference time, the OCV calculator is configured to add OCV measurement values of the battery cells to obtain a final OCV of the battery cells. In the above apparatus, if the previous SOC storage time is shorter than the reference time, the SOC estimator is configured to estimate the previously stored SOC value as an initial SOC. In the above apparatus, the reference time is about three months. The above apparatus further comprises a sensor configured to sense the OCV measurement values. In the above apparatus, the SOC table contains the relationship between a plurality of SOC values and OCVs obtained for a period of time.

Another aspect is an energy storage system comprising: a battery pack which comprises at least one battery tray each comprising one or more battery cells, wherein the battery tray is configured to supply power to at least one of a load and a grid system; an open circuit voltage (OCV) calculator configured to receive OCV measurement values of the battery cells of each battery tray when the power of the battery pack is turned on, and calculate a final OCV of the battery cells based at least in part on the OCV measurement values; and a state of charge (SOC) estimator configured to extract an SOC value corresponding to the final OCV from an SOC table and estimate the extracted SOC value as an initial SOC.

In the above system, the OCV calculator is configured to set a current at which an OCV of each of the battery cells is measured to be equal to or less than the amplitude of a reference current. In the above system, the amplitude of the reference current is about 3 Ampere. The system, further comprises: a memory storing a previous SOC storage time; and a comparator configured to compare the previous SOC storage time with a reference time when the power of the battery pack is turned on. In the above system, the reference time is a time required for the SOC of the battery cells to be reduced by about 10% via the self discharge of the battery cells.

Another aspect is a processor-readable storage device having processor-readable code embodied on the processor-readable storage device, the processor-readable code for programming one or more processors to perform a method of controlling a battery back which comprises at least one battery tray each comprising one or more battery cells, the method comprising: receiving OCV measurement values of the battery cells of each battery tray when the power of the battery pack is turned on, and calculate a final OCV of the battery cells based at least in part on the OCV measurement values; and extracting an SOC value corresponding to the final OCV from an SOC table and estimate the extracted SOC value as an initial SOC.

Another aspect is an apparatus for controlling a battery pack which comprises a plurality of battery cells, the apparatus comprising: an open circuit voltage (OCV) calculator configured to calculate an OCV of the battery cells based at least in part on OCV measurement values of the battery cells that are obtained when the power of the battery pack is turned on; a memory storing at least one of a previous SOC storage time and a reference battery current; and a state of charge (SOC) estimator configured to estimate an initial SOC for the battery cells based at least in part on i) the calculated OCV and ii) at least one of the previous SOC storage time and reference battery current.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the disclosed embodiments may be modified in many different forms, only certain embodiments will be illustrated in the drawings and described in detail in the written description. However, this is not intended to limit the present disclosure to particular modes of practice, and it is to be appreciated to cover all changes, equivalents, and substitutes that do not depart from the spirit and technical scope of the present disclosure. Certain detailed explanations of related art are omitted when it is deemed that they may unnecessarily obscure the essence of the present disclosure.

While such terms as "first," "second," etc. may be used to describe various components, such components must not be limited to the above terms. The above terms are used only to distinguish one component from another.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including" or "having," etc. are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Embodiments will be described below in more detail with reference to the accompanying drawings. Those components that are the same or are in correspondence are rendered the same reference numeral regardless of the figure number, and redundant explanations are omitted.

Figure 1:
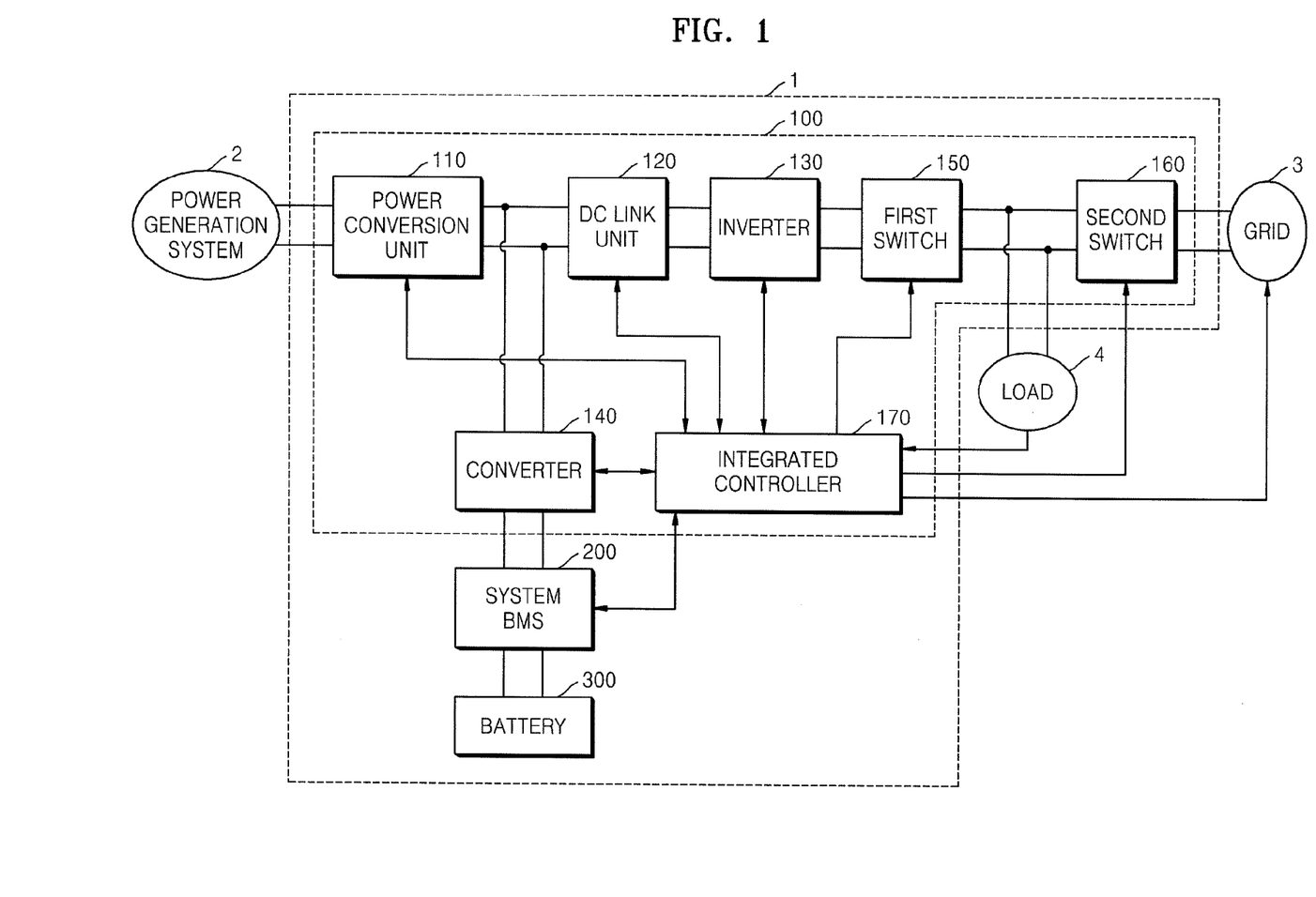
FIG. 1 is a diagram of an energy storage system according to an embodiment.

FIG. 1 is a diagram of an energy storage system 1 according to an embodiment.

Referring to FIG. 1, the energy storage system 1 supplies power to a load 4, in association with a power generation system 2 and a grid system 3. The power generation system 2 produces power by using an energy source and supplies the power to the energy storage system 1. The power generation system 2 may include any power generation system that generates power by using renewable energies, and examples thereof are a solar light power generation system, a wind power generation system, and a tidal power generation system.

The system 3 may include a power generation station, a power substation, a power transmission line, and the like. The system 3 supplies power to the energy storage system 1 to supply the power to the load 4 and/or a battery 300. Alternatively, the system 3 may receive power supplied by the energy storage system 1.

The load 4 may consume power produced by the power generation system 2, power stored in the battery 300, or power supplied by the system 3, and may be, for example, a home or a factory.

The energy storage system 1 may store power produced by the power generation system 2 in the battery 300 and may supply generated power to the system 3. Also, the energy storage system 1 may supply power stored in the battery 300 to the system 3, or may store power supplied by the system 3 in the battery 300. Also, the energy storage system 1 may perform an uninterruptible power supply (UPS) operation when power interruption occurs in the system 3.

The energy storage system 1 includes a power conversion system (PCS) 100 for controlling power conversion, a system battery management system (BMS) 200, and the battery 300. The system BMS 200 may be a battery pack control apparatus which is described later.

The PCS 100 converts power of the power generation system 2, the system 3, and the battery 300 into an appropriate power form and supplies the converted power to where the power is needed. The PCS 100 includes a power conversion unit 110, a direct current (DC) link unit 120, an inverter 130, a converter 140, a first switch 150, a second switch 160, and an integrated controller 170.

The power conversion unit 110 may be connected to the power generation system 2 and the DC link unit 120. The power conversion unit 110 provides power produced by the power generation system 2 to the DC link unit 120, and in this case, the power conversion unit 110 converts an output voltage into a DC link voltage.

The power conversion unit 110 may include a converter, a rectifier circuit, or the like, according to the power generation system 2. If power produced by the power generation system 2 is DC power, the power conversion unit 110 may be a converter for converting AC into DC. If power produced by the power generation system 2 is alternating current (AC) power, the power conversion unit 110 may be a rectifier circuit for converting AC power into DC power. If the power generation system 2 produces power from solar light, the power conversion unit 110 may include a maximum power point tracking (MPPT) converter that performs an MPPT control so that the power generation system 2 produces a maximum power according to change in the amount of a solar light, temperature, or the like.

The DC link unit 120 may be electrically connected to the power conversion unit 110 and the inverter 130. The DC link unit 120 may prevent an instantaneous voltage sag in the power generation system 2 or the system 3 and a peak load in the load 4 to stably maintain a DC link voltage.

The inverter 130 is a power conversion apparatus that is connected to the DC link unit 120 and the first switch 150. The inverter 130 may convert, in a discharge mode, a DC link voltage that is output by the power generation system 2 and/or the battery 300 into an AC voltage that is required by the system 3 and may output the AC voltage. Also, in a charge mode, the inverter 130 may rectify the AC voltage of the system 3 to produce a DC link voltage and may output the DC link voltage so as to store power of the system 3 in the battery 300. That is, the inverter 130 may be a bidirectional inverter of which input and output directions are changed.

The inverter 130 may include a filter for removing a harmonic wave from an AC voltage that is output to the system 3, a phase locked loop (PLL) circuit for synchronizing a phase of the output AC voltage and a phase of the AC voltage of the system 3, or the like. Also, the inverter 130 may perform a function of, for example, voltage variation range restriction, power-factor improvement, DC component removal, transient phenomena protection, or the like. The inverter 130 may stop its operation to minimize consumption of power during not-use.

The converter 140 is a power conversion apparatus that is electrically connected to the DC link unit 120 and the battery 300. The converter 140 may, in a discharge mode, DC-DC convert power stored in the battery 300 into a voltage level that is required by the inverter 130, that is, a DC link voltage and may output the DC link voltage. Also, the converter 140 may, in a charge mode, DC-DC convert power output by the power conversion unit 110 or power output by the inverter 130 into a voltage level that is required by the battery 300, that is, a charge voltage. That is, the converter 140 may be a bidirectional converter of which input and output directions are changed. The converter 140 may stop its operation to minimize consumption of power when charging or discharging of the battery 300 is not needed.

The first switch 150 and the second switch 160 may be connected to each other in series between the inverter 130 and the system 3, and perform on/off operations according to control of the integrated controller 170 to control the flow of current between the power generation system 2 and the system 3. The on/off of the first and second switches 15 and 16 may be determined according to states of the power generation system 2, system 3, and battery 300. For example, if a power amount required by the load 4 is high, the first switch 150 and the second switch 160 are both turned on to allow the power of the power generation system 2 and the system 3 to be used. If the power amount required by the load 4 is greater than the power of the power generation system 2 and the system 3, the power stored in the battery 300 may be supplied to the load 4. Also, if power interruption occurs in the system 3, the second switch 160 is turned off and the first switch 150 is turned on. By doing this, the power output by the power generation system 2 or the battery 300 is supplied to the load 4, and a flow of power that is originally intended to be supplied to the load 4, toward the system 3, that is, an individual operation, is prevented, so that an electric shock to a people working near, for example, a power line of the system 3, may be prevented.

The integrated controller 170 monitors states of the power generation system 2, the system 3, the battery 300, and the load 4, and according to the monitoring results, controls the power conversion unit 110, the inverter 130, the converter 140, the first switch 150, the second switch 160, and the system BMS 200. For example, the integrated controller 170 monitors whether power interruption occurs in the system 3, or whether the power generation system 2 produces power. Also, the integrated controller 170 may monitor an amount of power produced by the power generation system 2, a charged state of the battery 300, an amount of power consumed by the load 4, a time, or the like.

The system BMS 200 may be connected to the battery 300, and according to control of the integrated controller 170, may control charging and discharging operations of the battery 300. The system BMS 200 may perform at least one of: an overcharge protection function, an over-discharge protection function, an excess current protection function, an excess voltage protection function, an over heating protection function, or the like to protect the battery 300. To do this, the system BMS 200 may monitor the voltage, current, temperature, residual power amount, lifetime, state of charge, or the like of the battery 300, and may transmit the monitoring results to the integrated controller 170. Also, the system BMS 200 according to the present embodiment receives information about an open circuit voltage (OCV) to estimate an initial state of charge (SOC). Related methods are described in detail with reference to FIGS. 2 through 10 below.

The battery 300 may store power supplied by the power generation system 2 or power supplied by the system 3, and may supply the stored power to the load 4 or the system 3.

The battery 300 may include one or more battery racks that are connected in series and/or parallel. In this regard, the battery racks constitute the battery 300. Also, each of the battery racks may include one or more battery trays that are connected in series and/or parallel. The battery trays constitute the battery racks. Also, each of the battery trays may include one or more battery cells. The battery 300 may be embodied in any one of various battery cells, for example, a nickel-cadmium battery, a lead storage battery, a nickel metal hydride (NiMH) battery, a lithium ion battery, a lithium polymer battery, or the like.

Figure 2:
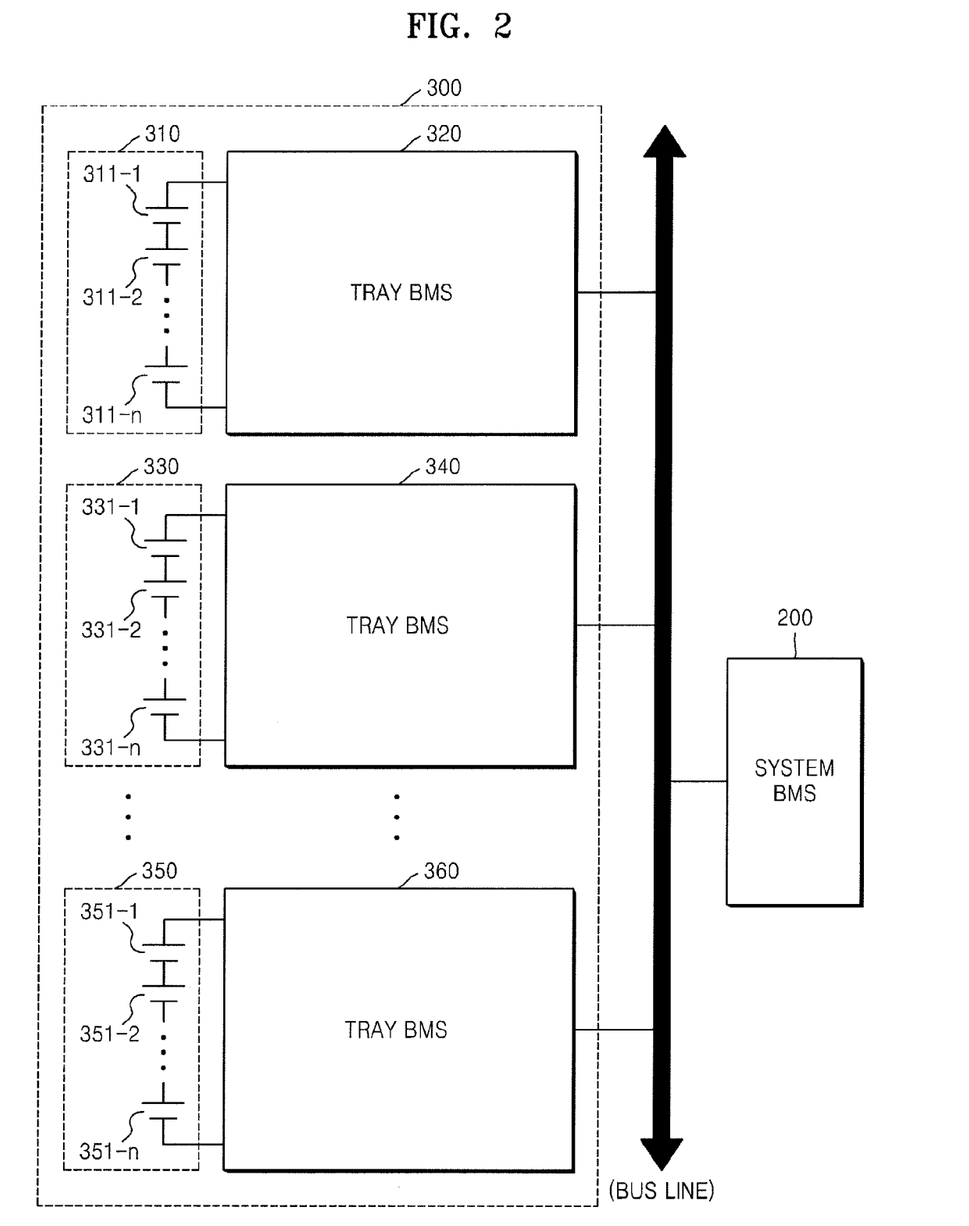
FIG. 2 is a diagram illustrating a battery and a system battery management system (BMS) illustrated in FIG. 1 according to an embodiment.

FIG. 2 is a diagram illustrating the battery 300 and the system BMS 200 illustrated in FIG. 1 according to an embodiment. Referring to FIG. 2, the battery 300 may include battery trays 310, 330, and 350 and tray BMSs 320, 340, and 360, wherein the number of battery trays may be identical to the number of tray BMSs. The battery 300 may be connected to the system BMS 200 via a bus line to perform bidirectional data communication. In this regard, the data communication method is, however, not limited thereto. For example, the system BMS 200 may communicate with the tray BMSs 320, 340, and 360 via controller area network (CAN) communication. Also, various other communication methods using a bus line may be used. Furthermore, communication methods that do not use a bus line may also be used herein.

The battery trays 310, 330, and 350 may include one or more battery cells 311-1 through 311-n, 331-1 through 331-n and 351-1 through 351-n, respectively. Also, when a battery is used in an energy storage system, the elements denoted by reference numerals 311-1 through 351-n in FIG. 2 may also indicate battery racks or battery cells of the battery 300. In the present embodiment, the elements denoted by reference numerals 311-1 through 351-n are battery cells. The elements denoted by reference numerals 311-1 through 351-n may also indicate battery trays or battery racks.

Figure 3:
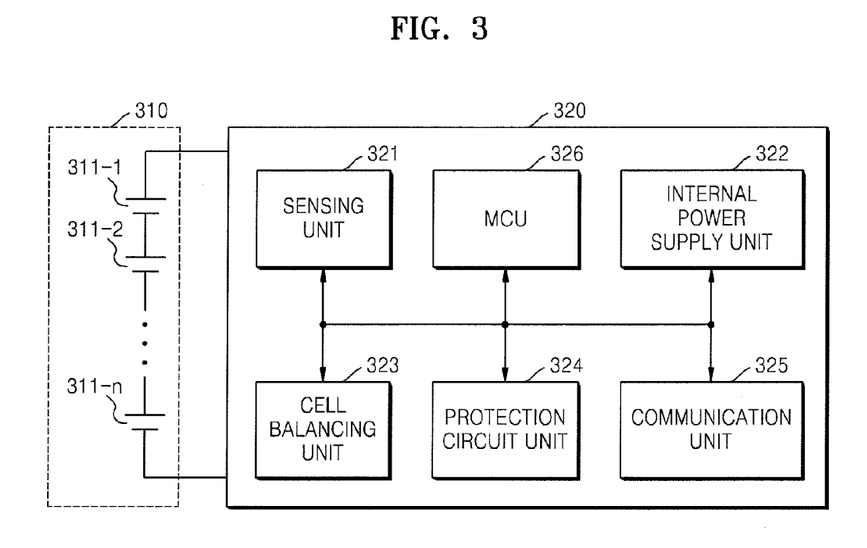
FIG. 3 is a detailed view of the battery illustrated in FIG. 2.

FIG. 3 is a detailed view of the tray BMS 320 illustrated in FIG. 2. Referring to FIG. 3, the tray BMS 320 includes a sensing unit 321, an internal power supply unit 322, a cell balancing unit 323, a protection circuit unit 324, a communication unit 325, and a main control unit (MCU) 326.

The sensing unit 321 may measure a total current of the battery tray 310, a total voltage of the battery tray 310, the temperature of the battery tray 310, and the surrounding temperature of the battery cells 311-1 through 311-n and delivers the measurement values to the MCU 326. Also, the sensing unit 321 may measure an open circuit voltage (OCV) based on the a total current of the battery tray 310, a total voltage of the battery tray 310, the temperature of the battery tray 310, and the surrounding temperature of the battery cells 311-1 through 311-n. When the battery cells 311-1 through 311-n are charged/discharged, excess voltage may occur due to chemical components. The excess voltage, however, is removed over time. After the battery cells 311-1 through 311-n are charged/discharged and then the excess voltage is removed, the sensing unit 321 measures an OCV of each of the battery cells 311-1 through 311-n. In one embodiment, because the excess voltage is not completely removed, the system BMS 200 controls by measuring an OCV only when an amplitude of the current of the battery cells 311-1 through 311-n is equal to or less than about 3 A.

Typically, the internal power supply unit 322 may supply power to the system BMS 200 by using an auxiliary battery. The cell balancing unit 323 may make a balance among charge states of the battery cells 311-1 through 311-n. That is, a cell having a relatively high charge state may be discharged and a cell having a relatively low charge state may be charged. The protection circuit unit 324 may be a circuit that protects the battery 300 from external impact, excess current, or a low voltage by using firmware. The communication unit 325 may perform data communication between the battery 300 and the system BMS 200 via, for example, a bus line. In the present embodiment, the communication unit 325 may transmit the measured OCV to the system BMS 200. The MCU 326 may control the tray BMS 320.

Figure 4:
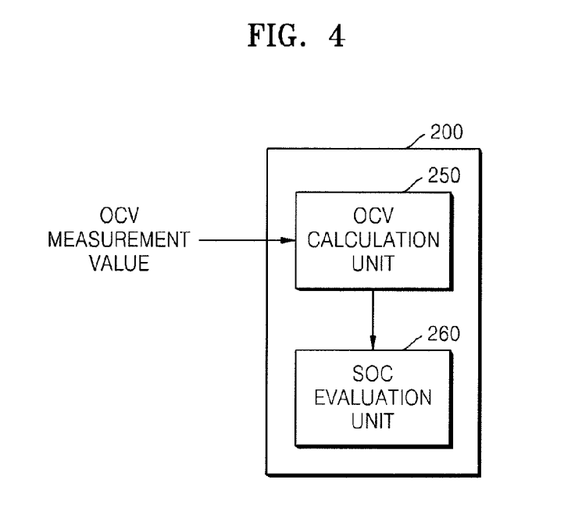
FIG. 4 is a detailed view of an example of the system BMS illustrated in FIG. 2.

FIG. 4 is a detailed view of an example of the system BMS 200 illustrated in FIG. 2. Referring to FIG. 4, the system BMS 200 includes an OCV calculation unit 250 and a state of charge (SOC) estimation unit 260.

The units 250 and 260 may be implemented by one or more processors and memories. In various embodiments, the processor may be configured as, for example, i) an advanced RISC machine (ARM) microcontroller and ii) Intel Corporation's microprocessors (e.g., the Pentium family microprocessors). In one embodiment, the processor is implemented with a variety of computer platforms using a single chip or multichip microprocessors, digital signal processors, embedded microprocessors, microcontrollers, etc. In another embodiment, the processor is implemented with a wide range of operating systems such as Unix, Linux, Microsoft DOS, Microsoft Windows 7/Vista/2000/9x/ME/XP, Macintosh OS, OS/2, Android, iOS and the like. The description of this paragraph applies to at least one of the units shown in FIGS. 3-7.

The system BMS 200 may receive OCV measurement values of the battery trays 310, 330, and 350 which have been sensed by the sensing units (e.g., the sensing unit 321) and transmitted by the communication units (e.g., the communication unit 325) the tray BMSs 320, 340, and 360.

When the OCV calculation unit 250 is turned on, it receives information about the OCV of each of the battery trays 310, 330, and 350, and calculates a final OCV of each of the battery cells 311-1 through 311-n, 331-1 through 331-n, and 351-1 through 351-n based on OCV measurement values. In this regard, because the excess voltage is not completely removed when the sensing unit 321 of each of the tray BMSs 320, 340, and 360 measures an OCV, the OCV calculation unit 250 may transmit to the battery trays 310, 330, and 350 a control signal that allows an OCV of each of the battery cells 311-1 through 311-n, 331-1 through 331-n, and 351-1 through 351-n to be measured only when the amplitude of the current of each battery is equal to or less than about 3 A.

The SOC estimation unit 260 extracts an SOC value corresponding to the calculated final OCV from an SOC table, and estimates the extracted SOC value as an initial SOC. For example, the SOC table may contain at least one of: the relationship between SOC values and battery temperatures obtained for a period of time and the relationship between SOC values and OCV values obtained for the period of time.

Figure 5:
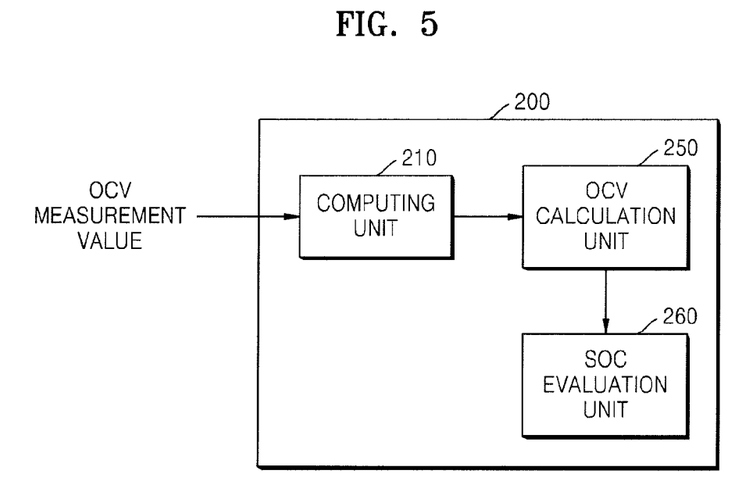
FIG. 5 is a detailed view of another example of the system BMS illustrated in FIG. 2.

FIG. 5 is a detailed view of another example of the system BMS 200 illustrated in FIG. 2. Referring to FIG. 5, the system BMS 200 includes a computing unit 210, the OCV calculation unit 250, and the SOC estimation unit 260.

When the computing unit 210 is turned on, it receives the OCV of each of the battery trays 310, 330, and 350 and calculates an average of the OCVs of the battery cells 311-1 through 351-n of each of the battery trays 310, 330, and 350. In one embodiment, in calculating the average OCV, the minimum OCV and the maximum OCV are not taken into consideration.

In one embodiment, the OCV calculation unit 250 multiples the OCV average output by the number of battery cells 311-1 through 351-n to obtain a final OCV.

The SOC estimation unit 260 extracts an SOC value corresponding to the final OCV from the SOC table and estimates the extracted SOC value as an initial SOC.

Figure 6:
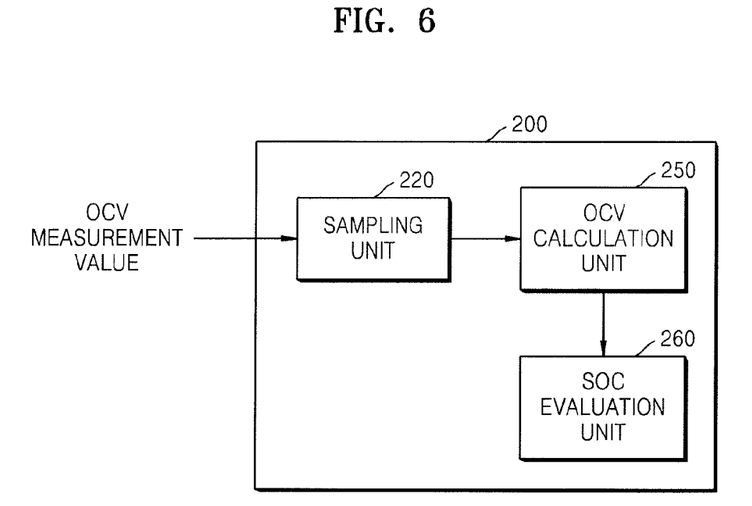
FIG. 6 is a detailed view of another example of the system BMS illustrated in FIG. 2.

FIG. 6 is a detailed view of another example of the system BMS 200 illustrated in FIG. 2. Referring to FIG. 6, the system BMS 200 includes a sampling unit 220, the OCV calculation unit 250, and the SOC estimation unit 260.

When the sampling unit 220 is turned on, the sampling unit 220 selects a predetermined number of battery cells from each of the battery trays 310, 330 and 350, and receives information about OCVs of the selected battery cells.

The OCV calculation unit 250 calculates an average of OCVs of the selected battery cells and multiples the calculated OCV average by the number of battery cells 311-1 through 351-n to obtain a final OCV.

The SOC estimation unit 260 extracts an SOC value corresponding to the final OCV from the SOC table and estimates the extracted SOC value as an initial SOC.

Figure 7:
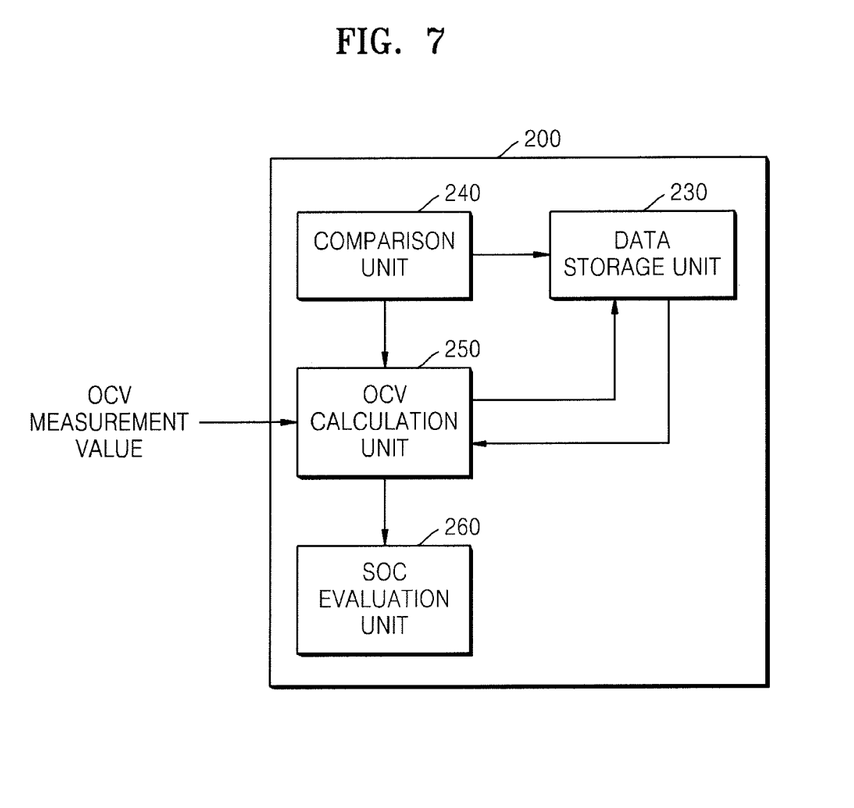
FIG. 7 is a detailed view of another example of the system BMS illustrated in FIG. 2.

FIG. 7 is a detailed view of another example of the system BMS 200 illustrated in FIG. 2. Referring to FIG. 7, the system BMS 200 includes a data storage unit 230, a comparison unit 240, the OCV calculation unit 250, and the SOC estimation unit 260. The data storage unit 230 stores a previous SOC storage time. The data storage unit 230 can be implemented by a conventional memory device. When the comparison unit 240 is turned on, the comparison unit 240 compares the previous SOC storage time stored in the data storage unit 230 with a reference time. If it is determined that the previous SOC storage time is equal to or longer than the reference time, the OCV calculation unit 250 receives the OCV of each of the battery cells 311-1 through 351-n and adds all the OCVs to obtain a final OCV of the battery cells 311-1 through 311-n, 331-1 through 331-n, and the 351-1 through 351-n. The SOC estimation unit 260 extracts an SOC value corresponding to the final OCV from the SOC table and estimates the extracted SOC value as an initial SOC. On the other hand, if it is determined that the previous SOC storage time is shorter than the reference time, the SOC estimation unit 260 estimates a previous SOC value stored in the data storage unit 230 as an initial SOC.

If the initial SOC of the battery 300 is estimated using only an OCV, the accuracy level of the initial SOC may be decreased. Accordingly, instead of estimating the initial SOC using only an OCV when power of the battery 300 is on, the SOC value is substantially periodically stored in the data storage unit 230 so that when the previous SOC storage time is equal to or longer than the reference time, an OCV is measured to estimate an SOC, and when the previous SOC storage time is shorter than the reference time, the previously stored SOC value is estimated as an initial SOC. In this regard, the reference time refers to a time required for the SOC of each of the battery cells 311-1 through 311-n, 331-1 through 331-n, and 351-1 through 351-n to be reduced by about 10% via the self discharge of the battery cells. For example, the reference time may be about 3 months.

Hereinafter, a method of controlling the system BMS 200 to estimate an initial SOC is described in detail with reference to FIGS. 8 through 11 below.

Figure 8:
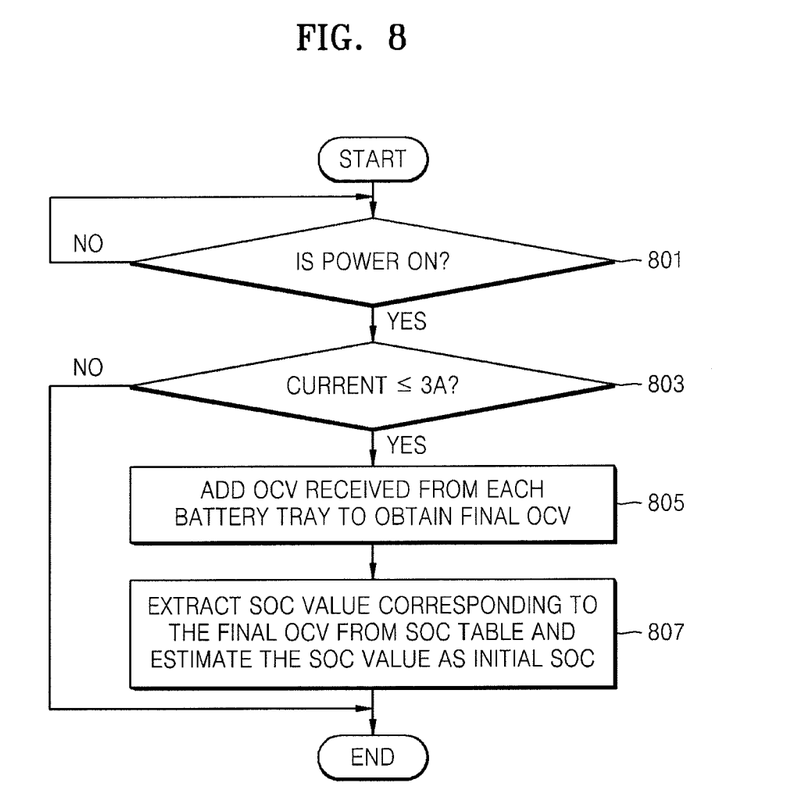
FIG. 8 is a flowchart illustrating a method of controlling the system BMS illustrated in FIG. 1 according to an embodiment.

FIG. 8 is a flowchart illustrating a method of controlling the system BMS illustrated 200 in FIG. 1 according to an embodiment. Depending on the embodiment, additional steps may be added, others removed, or the order of the steps changes in FIG. 8. Algorithms disclosed below may be coded in software executed by the processors and the codes may be stored in computer readable memory on a device equipped with various functions, such as a personal computer (PC), or may be discretely configured in a hardware manner. In one embodiment, the FIG. 8 procedure (or at least part of the procedure) is implemented in a conventional programming language, such as C or C++ or another suitable programming language. In one embodiment, the program is stored on a computer accessible storage medium. The storage medium may comprise any of a variety of technologies for storing information. In one embodiment, the storage medium comprises a random access memory (RAM), hard disks, floppy disks, digital video devices, compact discs, video discs, and/or other optical storage mediums, etc. In another embodiment, the procedure can be implemented with embedded software. The description of this paragraph applies to FIGS. 9-11.

Referring to FIG. 8, the system BMS 200 determines whether power of the battery 300 is on (operation 801), and if power of the battery 300 is on, the system BMS 200 determines whether a current of the battery 300 is equal to or less than a reference current, for example, about 3 A (operation 803). When battery cells are charged/discharged, excess voltage may occur due to chemical components. The excess voltage, however, is removed over time. As described above, after battery cells are charged/discharged and then the excess voltage is removed, an OCV of each of the battery cells is measured. In one embodiment, because the excess voltage is not completely removed, the tray BMSs 320, 340, and 360 are controlled by measuring an OCV only when the amplitude of the current of the battery cells is less than or equal to about 3 A.

If the amplitude of current is less than or equal to about 3 A, the system BMS 200 adds all the OCVs of the battery cells 311-1 through 351-n to obtain a final OCV (operation 805). Operation 803 may be modified to determine whether the amplitude of current is less than about 3 A. In this embodiment, the subsequent operations are performed accordingly. When the calculation of the final OCV is completed, the system BMS 200 extracts an SOC value corresponding to the final OCV from an SOC table and estimates the extracted SOC value as an initial SOC (operation 807). For example, the SOC table may contain SOC values with respect to the temperature of the battery 300 and the SOC of the battery 300 according to an OCV over time.

Figure 9:
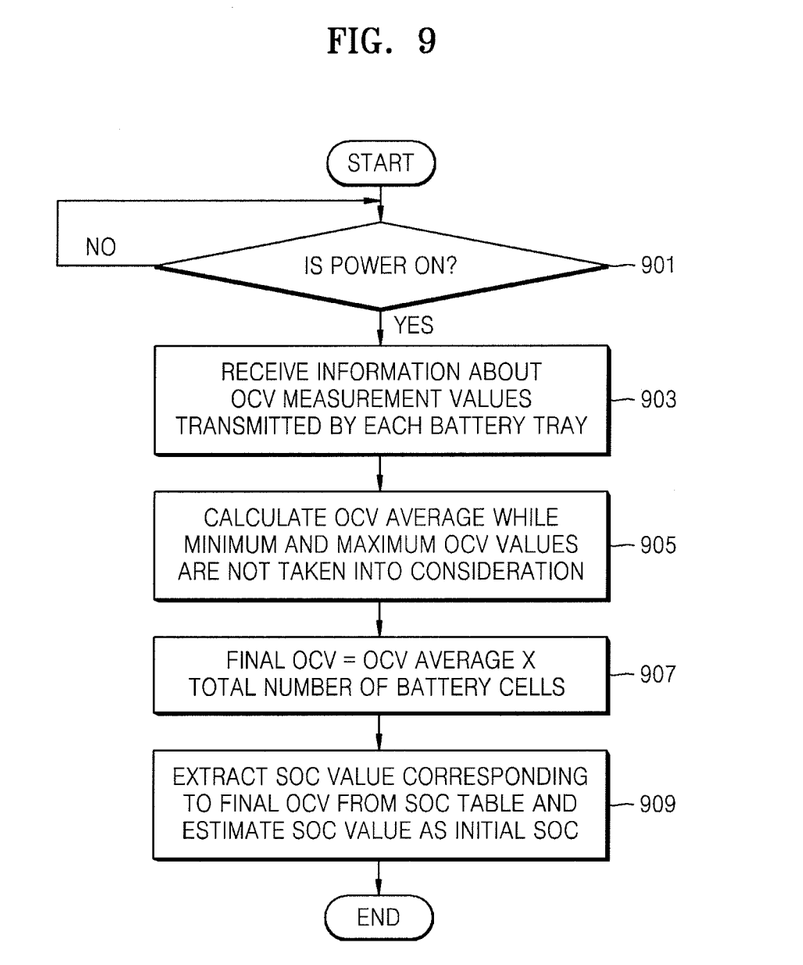
FIG. 9 is a flowchart illustrating a method of controlling the system BMS illustrated in FIG. 1 according to another embodiment.

FIG. 9 is a flowchart illustrating a method of controlling the system BMS 200 illustrated in FIG. 1 according to another embodiment.

Referring to FIG. 9, the system BMS 200 determines whether power of the battery 300 is on (operation 901), if power of the battery 300 is on, the system BMS 200 receives information about an OCV of each of the battery trays 310, 330, and 350 (operation 903).

Then, the system BMS 200 calculates an average of OCVs of the battery cells 311-1 through 351-n of the battery trays 310, 330, and 350, wherein the minimum OCV and the maximum OCV are not taken into consideration (operation 905).

Once the calculation of the OCV average is completed, the system BMS 200 multiples the OCV average by the number of battery cells 311-1 through 351-n to obtain a final OCV (operation 907).

Once the calculation of the final OCV is completed, the system BMS 200 extracts an SOC value corresponding to the final OCV from an SOC table and estimates the extracted SOC value as an initial SOC (operation 909).

Figure 10:
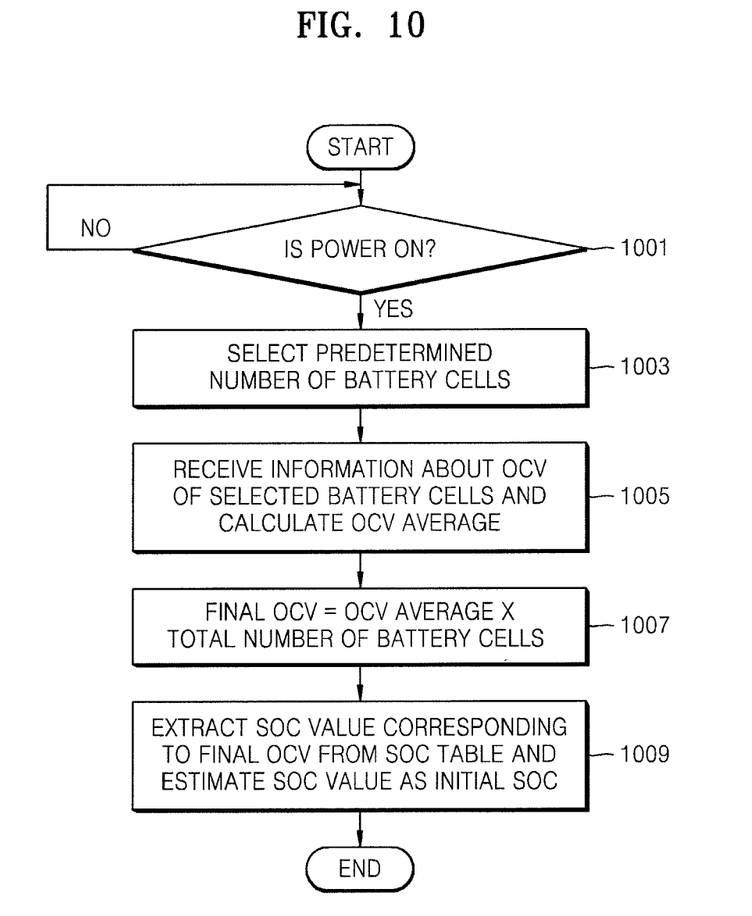
FIG. 10 is a flowchart illustrating a method of controlling the system BMS illustrated in FIG. 1 according to another embodiment.

FIG. 10 is a flowchart illustrating a method of controlling the system BMS 200 illustrated in FIG. 1 according to another embodiment.

Referring to FIG. 10, the system BMS 200 determines whether power of the battery 300 is on (operation 1001), if power of the battery 300 is on, the system BMS 200 selects a predetermined number of battery cells from the battery trays 310, 330, and 350 (operation 1003).

Then, the system BMS 200 receives information about an OCV of each of the selected battery cells and calculates an average OCV of the selected battery cells (operation 1005).

If the average OCV of the selected battery cells is completely calculated, the system BMS 200 may multiply the calculated OCV average by the number of battery cells 311-1 through 351-n to obtain a final OCV (operation 1007). Once the calculation of the final OCV is completed, the system BMS 200 extracts an SOC value corresponding to the final OCV from an SOC table and estimates the extracted SOC value as an initial SOC (operation 1009).

Figure 11:
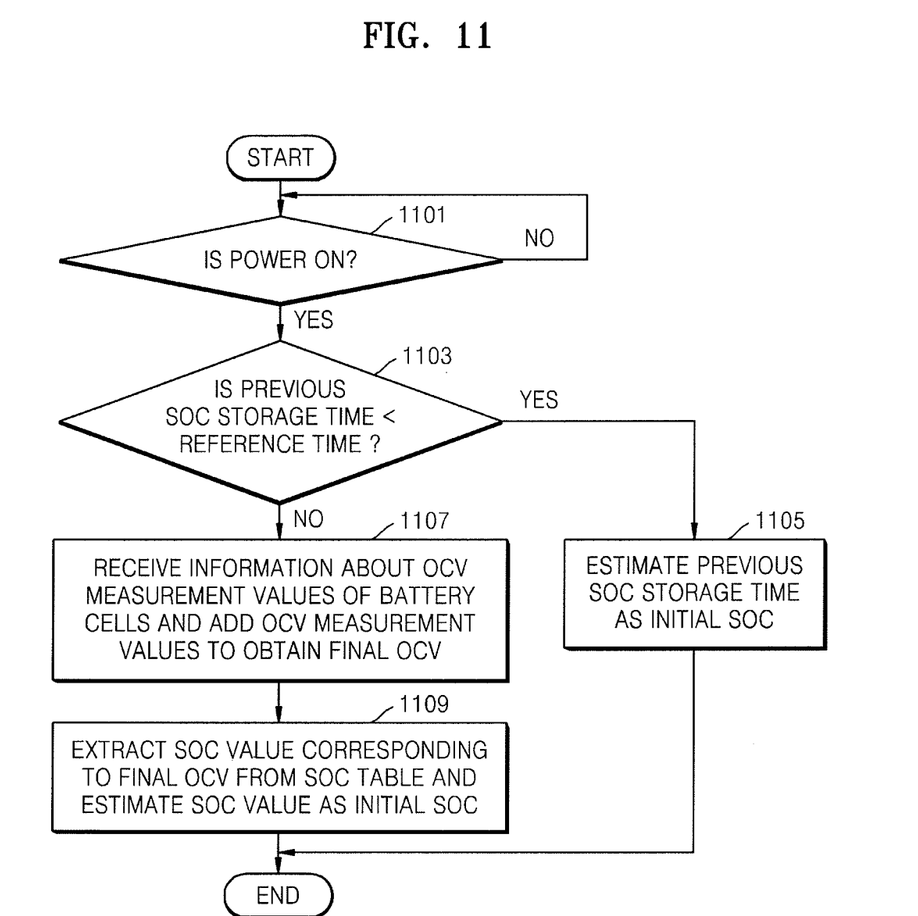
FIG. 11 is a flowchart illustrating a method of controlling the system BMS illustrated in FIG. 1 according to another embodiment.

FIG. 11 is a flowchart illustrating a method of controlling the system BMS 200 illustrated in FIG. 1 according to another embodiment.

Referring to FIG. 11 the system BMS 200 determines whether power of the battery 300 is on (operation 1101), if power of the battery 300 is on, the system BMS 200 determines whether a previous SOC storage time that has been stored in the data storage unit 230 is shorter than a reference time (operation 1103). In this regard, the reference time refers to a time required for the SOC of each of the battery cells 311-1 through 351-n to be reduced by about 10% via the self discharge of the battery cells. For example, the reference time may be about 3 months.

If the previous SOC storage time is shorter than the reference time, the system BMS 200 estimates the previous SOC value stored in the data storage unit 230 as an initial SOC value (operation 1105).

On the other hand, if the previous SOC storage time is equal to or longer than the reference time, the system BMS 200 adds all the OCVs to obtain a final OCV (operation 1107). Operation 11103 may be modified to determine whether a previous SOC storage time is equal to or shorter than a reference time. In this embodiment, the subsequent operations are performed accordingly.

If the calculation of the final OCV is completed, the system BMS 200 extracts an SOC value corresponding to the final OCV from an SOC table and estimates the extracted SOC value as an initial SOC (operation 1109).

As described above, according to at least one of the above described embodiments, a more accurate estimation of an initial SOC can be obtained because the initial SOC can be estimated based on the state of a battery.

It should be understood that the above embodiments are considered in a descriptive sense only and not for purposes of limitation. Furthermore, descriptions of features or aspects within each embodiment should typically be considered as available for other similar features or aspects in other embodiments. For the sake of brevity, conventional electronics, control systems, software, and other functional aspects of the systems may not be described in detail. Furthermore, the connecting lines or connectors shown in the various figures presented are intended to represent certain functional relationships and/or physical or logical connections between the various elements. It should be noted that many alternative or additional functional relationships, physical connections, or logical connections may be present in a practical device.

The use of the terms "a" and "an" and "the" and similar referents in the context of describing the embodiments (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. Moreover, it is well understood by one of ordinary skill in the art that numerous modifications, adaptations, and changes may be made under design conditions and factors without departing from the spirit and scope of the following claims and within the range of equivalents thereof.

What is claimed is:

1. An apparatus for controlling a battery pack which comprises at least one battery tray each comprising one or more battery cells, the apparatus comprising:
   an open circuit voltage (OCV) calculator configured to receive OCV measurement values of the battery cells of each battery tray when the power of the battery pack is turned on, and calculate a final OCV of the battery cells based at least in part on the OCV measurement values; and
   a state of charge (SOC) estimator configured to extract an SOC value corresponding to the final OCV from an SOC
   wherein the SOC table contains SOC values with respect to the temperature of the battery cells and the SOC of the battery cells according to an OCV over time, and
   further comprising a sampler configured to select a predetermined number of battery cells from the total number of the battery cells, wherein the OCV calculator is configured to calculate an average of OCVs of the selected battery cells and multiply the calculated OCV average by the total number of the battery cells table and estimate the extracted SOC value as an initial SOC.

2. The apparatus of claim 1, wherein the OCV calculator is configured to set a current at which an OCV of each of the battery cells is measured to be less than or equal to the amplitude of a reference current.

3. The apparatus of claim 2, wherein the amplitude of the reference current is about 3 Ampere.

4. The apparatus of claim 1, further comprising an average OCV calculator configured to calculate an average of OCVs of the battery cells, wherein the minimum OCV and the maximum OCV are not taken into consideration.

5. The apparatus of claim 4, wherein the OCV calculator is configured to multiply the OCV average by the total number of battery cells to obtain the final OCV.

6. The apparatus of claim 1, further comprising:
a memory storing a previous SOC storage time; and
a comparator configured to compare the previous SOC storage time with a reference time when the power of the battery pack is turned on.

7. The apparatus of claim 6, wherein the reference time is a time required for the SOC of the battery cells to be reduced by about 10% via the self discharge of the battery cells.

8. The apparatus of claim 7, wherein if the previous SOC storage is equal to or longer than the reference time, the OCV calculator is configured to add OCV measurement values of the battery cells to obtain a final OCV of the battery cells.

9. The apparatus of claim 8, wherein if the previous SOC storage time is shorter than the reference time, the SOC estimator is configured to estimate the previously stored SOC value as an initial SOC.

10. The apparatus of claim 6, wherein the reference time is about three months.

11. The apparatus of claim 1, further comprising a sensor configured to sense the OCV measurement values.

12. The apparatus of claim 1, wherein the SOC table contains the relationship between a plurality of SOC values and OCVs obtained for a period of time.

13. An energy storage system comprising:
a battery pack which comprises at least one battery tray each comprising one or more battery cells, wherein the battery tray is configured to supply power to at least one of a load and a grid system;
an open circuit voltage (OCV) calculator configured to receive OCV measurement values of the battery cells of each battery tray when the power of the battery pack is turned on, and calculate a final OCV of the battery cells based at least in part on the OCV measurement values; and
a state of charge (SOC) estimator configured to extract an SOC value corresponding to the final OCV from an SOC
wherein the SOC table contains SOC values with respect to the temperature of the battery cells and the SOC of the battery cells according to an OCV over time, and
further comprising a sampler configured to select a predetermined number of battery cells from the total number of the battery cells,
wherein the OCV calculator is configured to calculate an average of OCVs of the selected battery cells and multiply the calculated OCV average by the total number of the battery cells table and estimate the extracted SOC value as an initial SOC.

14. The system of claim 13, wherein the OCV calculator is configured to set a current at which an OCV of each of the battery cells is measured to be equal to or less than the amplitude of a reference current.

15. The system of claim 14, wherein the amplitude of the reference current is about 3 Ampere.

16. The system of claim 13, further comprising:
a memory storing a previous SOC storage time; and
a comparator configured to compare the previous SOC storage time with a reference time when the power of the battery pack is turned on.

17. The system of claim 16, wherein the reference time is a time required for the SOC of the battery cells to be reduced by about 10% via the self discharge of the battery cells.

18. A processor-readable storage device having processor-readable code embodied on the processor-readable storage device, the processor-readable code for programming one or more processors to perform a method of controlling a battery back which comprises at least one battery tray each comprising one or more battery cells, the method comprising:
receiving OCV measurement values of the battery cells of each battery tray when the power of the battery pack is turned on, and calculate a final OCV of the battery cells based at least in part on the OCV measurement values; and
extracting an SOC value corresponding to the final OCV from an SOC table and estimate the extracted SOC
wherein the SOC table contains SOC values with respect to the temperature of the battery cells and the SOC of the battery cells according to an OCV over time, and
further comprising a sampler configured to select a predetermined number of battery cells from the total number of the battery cells,
wherein the OCV calculator is configured to calculate an average of OCVs of the selected battery cells and multiply the calculated OCV average by the total number of the battery cells value as an initial SOC.

19. An apparatus for controlling a battery pack which comprises a plurality of battery cells, the apparatus comprising:
an open circuit voltage (OCV) calculator configured to calculate an OCV of the battery cells based at least in part on OCV measurement values of the battery cells that are obtained when the power of the battery pack is turned on;
a memory storing at least one of a previous SOC storage time and a reference battery current; and
a state of charge (SOC) estimator configured to estimate an initial SOC for the battery cells based at least in part on i) the calculated OCV and ii) at least one of the previous SOC storage time and reference battery current
wherein the SOC table contains SOC values with respect to the temperature of the battery cells and the SOC of the battery cells according to an OCV over time, and
further comprising a sampler configured to select a predetermined number of battery cells from the total number of the battery cells,
wherein the OCV calculator is configured to calculate an average of OCVs of the selected battery cells and multiply the calculated OCV average by the total number of the battery cells.

* * * * *

UNITED STATES PATENT AND TRADEMARK OFFICE
CERTIFICATE OF CORRECTION

| | |
|---|---|
| PATENT NO. | : 9,599,675 B2 |
| APPLICATION NO. | : 13/554998 |
| DATED | : March 21, 2017 |
| INVENTOR(S) | : Han-Seok Yun |

Page 1 of 1

It is certified that error appears in the above-identified patent and that said Letters Patent is hereby corrected as shown below:

In the Specification

In Column 8 at Line 14 (approx.), Change "the a" to --the--.

In the Claims

In Column 12 at Lines 60-61, In Claim 1, after "an SOC" insert --table and estimate the extracted SOC value as an initial SOC--.

In Column 13 at Lines 4-5, In Claim 1, change "cells table and estimate the extracted SOC value as an initial SOC." to --cells.--.

In Column 13 at Lines 55-56, In Claim 13, after "an SOC" insert --table and estimate the extracted SOC value as an initial SOC--.

In Column 14 at Lines 1-2, In Claim 13, change "cells table and estimate the extracted SOC value as an initial SOC." to --cells.--.

In Column 14 at Line 29, In Claim 18, after "extracted SOC" insert --value as an initial SOC--.

In Column 14 at Line 39, In Claim 18, change "cells value as an initial SOC." to --cells.--.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*